United States Patent
Tanaka et al.

(10) Patent No.: US 12,464,864 B2
(45) Date of Patent: Nov. 4, 2025

(54) LIGHT-EMITTING ELEMENT

(71) Applicant: NICHIA CORPORATION, Anan (JP)

(72) Inventors: Hidetoshi Tanaka, Anan (JP); Hirofumi Nishiyama, Tokushima (JP); Kentaro Yagi, Tokushima (JP)

(73) Assignee: NICHIA CORPORATION, Anan (JP)

( * ) Notice: Subject to any disclaimer, the term of this patent is extended or adjusted under 35 U.S.C. 154(b) by 611 days.

(21) Appl. No.: 17/850,585

(22) Filed: Jun. 27, 2022

(65) Prior Publication Data

US 2023/0006100 A1 Jan. 5, 2023

(30) Foreign Application Priority Data

Jun. 30, 2021 (JP) .................. 2021-108451

(51) Int. Cl.
*H10H 20/825* (2025.01)
*H10H 20/831* (2025.01)

(52) U.S. Cl.
CPC ...... *H10H 20/825* (2025.01); *H10H 20/8312* (2025.01)

(58) Field of Classification Search
CPC ... H10H 20/00–882; H10H 29/00–142; H10H 29/30–962; H10N 50/10; H10D 84/961; H05K 2201/03–0397
See application file for complete search history.

(56) References Cited

U.S. PATENT DOCUMENTS

| | | |
|---|---|---|
| 2006/0027820 A1 | 2/2006 | Cao |
| 2008/0211400 A1 | 9/2008 | Kim et al. |
| 2009/0001389 A1* | 1/2009 | Wang ............ H10H 29/10 257/89 |
| 2013/0099265 A1 | 4/2013 | Hwang |
| 2013/0207153 A1 | 8/2013 | Kamiya et al. |
| 2013/0221321 A1* | 8/2013 | Sheu ............ H10H 20/812 257/13 |
| 2017/0213868 A1 | 7/2017 | Damilano et al. |
| 2019/0164944 A1 | 5/2019 | Chae et al. |
| 2019/0198561 A1 | 6/2019 | Wildeson et al. |
| 2020/0402964 A1 | 12/2020 | Kim |
| 2021/0118946 A1* | 4/2021 | Simon ............ H10H 29/142 |
| 2023/0051845 A1* | 2/2023 | Zollner ............ H10H 29/14 |

FOREIGN PATENT DOCUMENTS

| | | |
|---|---|---|
| JP | 2004-260111 A | 9/2004 |
| JP | 2009-510762 A | 3/2009 |
| JP | 2013-093542 A | 5/2013 |
| JP | 2013-168444 A | 8/2013 |
| JP | 2017-513225 A | 5/2017 |
| JP | 2021-504754 A | 2/2021 |

\* cited by examiner

Primary Examiner — Shahed Ahmed
(74) Attorney, Agent, or Firm — Foley & Lardner LLP

(57) ABSTRACT

A stacked body includes a long side and a short side in a top view. The long side extends in a first direction. The short side extends in a second direction orthogonal to the first direction. The short side is shorter than the long side. A light emission peak wavelength of a first active layer is different from a light emission peak wavelength of a second active layer. A first n-type layer includes a first n-side contact portion contacting a first electrode. A second n-type layer includes a second n-side contact portion contacting a second electrode. In a top view, a center of the first n-side contact portion is separated from a first line that passes through a center of the second n-side contact portion and is parallel to the first direction.

18 Claims, 7 Drawing Sheets

LIGHT-EMITTING ELEMENT

CROSS-REFERENCE TO RELATED APPLICATION

This application claims priority to Japanese Patent Application No. 2021-108451, filed on Jun. 30, 2021, the disclosure of which is hereby incorporated by reference in its entirety.

BACKGROUND

The present disclosure relates to a light-emitting element.

For example, the specification of US Patent Application Publication No. 2009/0001389 discusses a configuration in which a first LED that includes a first active region emitting green light and a second LED that includes a second active region emitting blue light are stacked with a tunnel junction interposed.

SUMMARY

Certain embodiments of the present invention are directed to a light-emitting element in which unevenness of the light emission distribution is low and chromaticity adjustment is possible.

According to one embodiment of the invention, a light-emitting element includes a stacked body made of a nitride semiconductor, the stacked body including a long side and a short side in a top view, the long side extending in a first direction, the short side extending in a second direction orthogonal to the first direction, the short side being shorter than the long side, the stacked body including a first n-type layer, a first active layer located on the first n-type layer, a first p-type layer located on the first active layer, a tunnel junction layer located on the first p-type layer, a second n-type layer located on the tunnel junction layer, a second active layer located on the second n-type layer, and a second p-type layer located on the second active layer; a first electrode electrically connected with the first n-type layer; a second electrode electrically connected with the second n-type layer; and a third electrode electrically connected with the second p-type layer. A light emission peak wavelength of the first active layer is different from a light emission peak wavelength of the second active layer. The first n-type layer includes a first n-side contact portion contacting the first electrode. The second n-type layer includes a second n-side contact portion contacting the second electrode. A center of the first n-side contact portion is separated from a first line in a top view. The first line passes through a center of the second n-side contact portion and is parallel to the first direction.

According to certain embodiments of the invention, a light-emitting element in which unevenness of the light emission distribution is low and chromaticity adjustment is possible can be provided.

DETAILED DESCRIPTION

Figure 1:
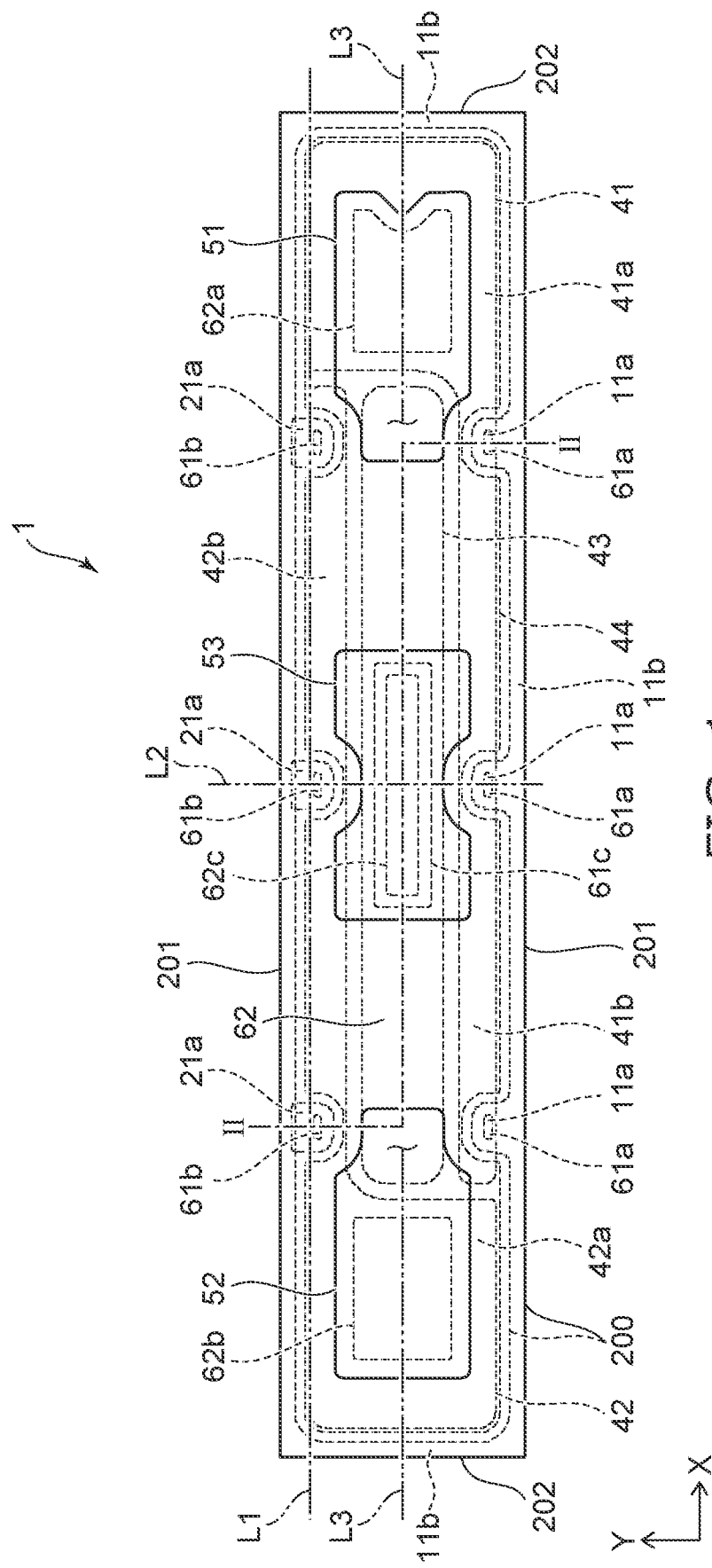
FIG. 1 is a schematic top view of a light-emitting element of a first embodiment of the invention.

Exemplary embodiments will now be described with reference to the drawings. Similar components in the drawings are marked with like reference numerals. The drawings schematically show embodiments in which the scales, spacing, positional relationships, and the like of the members may be exaggerated, or some of the members may not be illustrated. Cut-portion end views that show only cutting planes may be used as cross-sectional views.

First Embodiment

FIG. 1 is a schematic top view of a light-emitting element 1 of a first embodiment of the invention.

Figure 2:
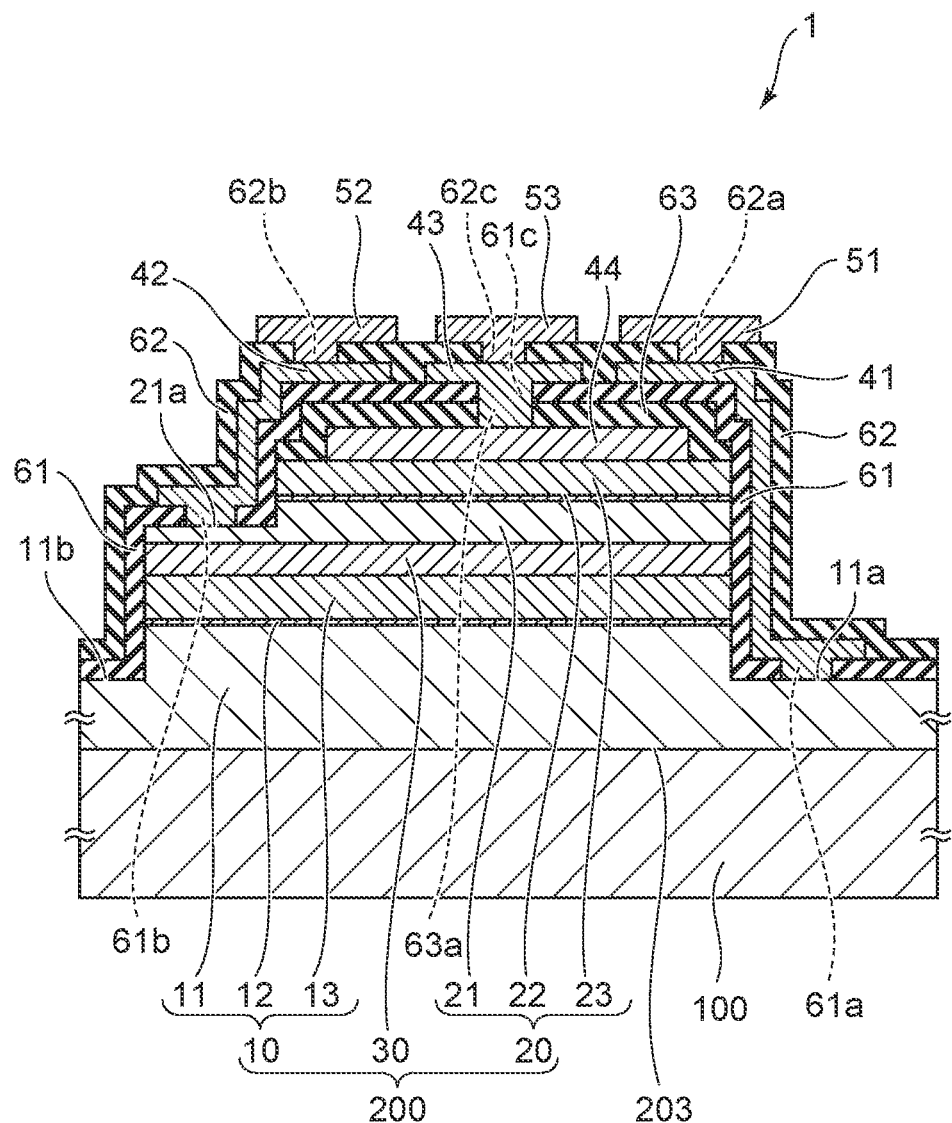
FIG. 2 is a schematic cross-sectional view along line II-II of FIG. 1.

FIG. 2 is a schematic cross-sectional view along line II-II of FIG. 1. The light-emitting element 1 includes a substrate 100, and a stacked body 200 that is located on the substrate 100. The stacked body 200 includes a first light-emitting part 10 located on the substrate 100, a tunnel junction layer 30 located on the first light-emitting part 10, and a second light-emitting part 20 located on the tunnel junction layer 30.

The substrate 100 may include, for example, an insulating substrate of spinel ($MgAl_2O_4$) or sapphire having one of a C-plane, an R-plane, or an A-plane as a major surface. Also, a conductive substrate of GaN, SiC (including 6H, 4H, or 3C), ZnS, ZnO, GaAs, Si, etc., may be used as the substrate 100. The substrate 100 may be omitted from the light-emitting element 1.

As shown in FIG. 1, in a top view, the stacked body 200 includes a pair of long sides 201 that extend in a first direction X, and a pair of short sides 202 that are shorter than the long sides 201 and extend in a second direction Y that is orthogonal to the first direction X. In a top view, the stacked body 200 is, for example, rectangular. The corners of the rectangle may be right angles or may be rounded.

The stacked body 200 is made of a nitride semiconductor. In the specification, "nitride semiconductor" includes, for example, all compositions of semiconductors of the chemical formula $In_xAl_yGa_{1-x-y}N$ ($0 \leq x \leq 1$, $0 \leq y \leq 1$, and $x+y \leq 1$) for which the composition ratios x and y are changed within the ranges respectively. "Nitride semiconductor" further includes Group V elements other than N (nitrogen) in the chemical formula recited above, various elements added to control various properties such as the conductivity type, etc.

The first light-emitting part 10 includes a first n-type layer 11 located on the substrate 100, a first active layer 12 located on the first n-type layer 11, and a first p-type layer 13 located on the first active layer 12. The tunnel junction layer 30 is located on the first p-type layer 13. The second light-emitting part 20 includes a second n-type layer 21 located on the tunnel junction layer 30, a second active layer 22 located on the second n-type layer 21, and a second p-type layer 23 located on the second active layer 22.

For example, the first n-type layer 11, the first active layer 12, the first p-type layer 13, the tunnel junction layer 30, the second n-type layer 21, the second active layer 22, and the second p-type layer 23 are formed on the substrate 100 in this order by MOCVD (metal organic chemical vapor deposition).

The first n-type layer 11 and the second n-type layer 21 include, for example, Si (silicon) as an n-type impurity. The first p-type layer 13 and the second p-type layer 23 include, for example, Mg (magnesium) as a p-type impurity. The first active layer 12 and the second active layer 22 are light-emitting layers that emit light and have, for example, MQW (Multiple Quantum Well) structures that include multiple barrier layers and multiple well layers. The light emission peak wavelength of the first active layer 12 and the light emission peak wavelength of the second active layer 22 are different from each other.

The tunnel junction layer 30 includes at least one semiconductor layer of a p-type layer that includes a higher p-type impurity concentration than the first p-type layer 13 or an n-type layer that includes a higher n-type impurity concentration than the second n-type layer 21.

The upper surface of the first n-type layer 11 includes a first n-side contact portion 11a. The first active layer 12, the first p-type layer 13, the tunnel junction layer 30, and the second light-emitting part 20 are not provided at the first n-side contact portion 11a; thus, the first n-side contact portion 11a is exposed from the first active layer 12, the first p-type layer 13, the tunnel junction layer 30, and the second light-emitting part 20.

An outer perimeter portion 11b also is included at the upper surface of the first n-type layer 11. The first active layer 12, the first p-type layer 13, the tunnel junction layer 30, and the second light-emitting part 20 are not provided at the outer perimeter portion 11b; thus, the outer perimeter portion 11b is exposed from the first active layer 12, the first p-type layer 13, the tunnel junction layer 30, and the second light-emitting part 20. As shown in FIG. 1, the outer perimeter portion 11b is positioned at the outermost perimeter of the stacked body 200 and is continuous along the long side 201 and the short side 202 of the stacked body 200.

The upper surface of the second n-type layer 21 includes a second n-side contact portion 21a. The second active layer 22 and the second p-type layer 23 are not provided at the second n-side contact portion 21a; thus, the second n-side contact portion 21a is exposed from the second active layer 22 and the second p-type layer 23.

As shown in FIG. 1, in a top view, the multiple first n-side contact portions 11a are separated from each other in the first direction X. Also, in a top view, multiple second n-side contact portions 21a are separated from each other in the first direction X.

According to the embodiment, the quantity of the first n-side contact portions 11a and the quantity of the second n-side contact portions 21a are equal. For example, in FIG. 1, three second n-side contact portions 21a are separated from each other in the first direction X, and three first n-side contact portions 11a are separated from each other in the first direction X. The quantity of the second n-side contact portions 21a may be one, two, four, or more. Also, the quantity of the first n-side contact portions 11a may be one, two, four, or more.

In a top view, the center of the first n-side contact portion 11a is separated from a first line L1 that passes through the center of the second n-side contact portion 21a and is parallel to the first direction X. In a top view, the first n-side contact portion 11a and the second n-side contact portion 21a are separated from each other in a direction crossing the first direction X. For example, in a top view, the first n-side contact portion 11a is positioned on a second line L2 that passes through the center of the second n-side contact portion 21a and is parallel to the second direction Y.

As shown in FIG. 2, the light-emitting element 1 further includes a first electrode 41, a second electrode 42, a third electrode 43, a fourth electrode 44, a first insulating film 61, a second insulating film 62, and a cover film 63.

The first insulating film 61 covers the cover film 63 and the surface of the stacked body 200 at the side opposite to the substrate 100 and protects the stacked body 200. The first insulating film 61 includes, for example, SiN, $SiO_2$, etc.

The first electrode 41, the second electrode 42, and the third electrode 43 are located on the first insulating film 61. The first electrode 41 is made of a metal material. For example, a metal such as Au, Pt, Pd, Rh, Ni, W, Mo, Cr, Ti, Al, Cu, or the like, or an alloy that includes such metals can be used as the first electrode 41. The first electrode 41 may have a single-layer structure or a stacked structure in which multiple layers are stacked. For example, the first electrode 41 can have a stacked structure in which a Ti layer, an Al—Si—Cu alloy layer, a Ti layer, a Pt layer, a Au layer, and a Ti layer are stacked in this order. A metal material similar to the first electrode 41 can be used as the second and third electrodes 42 and 43.

A portion of the first electrode 41 contacts a portion of the first n-side contact portion 11a and is electrically connected with the first n-type layer 11 via a first opening 61a formed in the first insulating film 61.

A portion of the second electrode 42 contacts a portion of the second n-side contact portion 21a and is electrically connected with the second n-type layer 21 via a second opening 61b formed in the first insulating film 61.

The third electrode 43 is located at the upper surface of the fourth electrode 44 via the cover film 63 and the first insulating film 61. A portion of the third electrode 43 contacts a portion of the fourth electrode 44 via a third opening 61c formed in the first insulating film 61 and a fourth opening 63a formed in the cover film 63. The third electrode 43 is electrically connected with the second p-type layer 23 via the fourth electrode 44.

The fourth electrode 44 is located at the upper surface of the second p-type layer 23 and is electrically connected with the second p-type layer 23. The resistivity of the fourth electrode 44 is less than the resistivity of the second p-type layer 23. The fourth electrode 44 is made of a metal material. For example, a metal such as Ag, Al, Rh, Ni, Ti, Pt or the like, or an alloy that includes such metals can be used as the fourth electrode 44. The fourth electrode 44 diffuses the current supplied via the third electrode 43 and a third external connection part 53 that is described below in the planar direction of the second p-type layer 23.

The cover film 63 covers the side surface and the upper surface of the fourth electrode 44 and protects the fourth electrode 44. The cover film 63 is an insulating film. For example, an oxide or a nitride that includes at least one selected from the group consisting of Si, Ti, Zr, Nb, Ta, Al, and Hf can be used as the material of the cover film 63. The cover film 63 can include, for example, SiN, $SiO_2$, etc.

As shown in FIG. 1, the first electrode 41 includes a first portion 41a, and a first extension portion 41b that extends in the first direction X from the first portion 41a. The second electrode 42 includes a second portion 42a, and a second extension portion 42b that extends in the first direction X from the second portion 42a. In a top view, the first portion 41a of the first electrode 41 and the second portion 42a of the second electrode 42 are separated from each other in the first direction X. In a top view, the third electrode 43 extends in the first direction X between the first portion 41a of the first electrode 41 and the second portion 42a of the second electrode 42. In a top view, the first extension portion 41b of the first electrode 41 and the second extension portion 42b of the second electrode 42 are separated from each other in the second direction Y. In a top view, the third electrode 43 is positioned between the first extension portion 41b and the second extension portion 42b in the second direction Y.

The second insulating film 62 covers the first insulating film 61, the first electrode 41, the second electrode 42, and the third electrode 43. The second insulating film 62 protects the first insulating film 61, the first electrode 41, the second electrode 42, and the third electrode 43. Also, the second insulating film 62 is located between the first electrode 41 and the second electrode 42, between the first electrode 41 and the third electrode 43, and between the second electrode 42 and the third electrode 43. The second insulating film 62 electrically insulates between the first electrode 41 and the second electrode 42, between the first electrode 41 and the third electrode 43, and between the second electrode 42 and the third electrode 43. The second insulating film 62 can include, for example, SiN, $SiO_2$, etc.

The light-emitting element 1 further includes a first external connection part 51, a second external connection part 52, and the third external connection part 53 that are located on the second insulating film 62.

For example, a metal such as Ti, Pt, Rh, Au, Ni, Ta, Zr, or the like, or an alloy that includes such metals can be used as the first external connection part 51. The first external connection part 51 may have a single-layer structure, or a stacked structure in which multiple layers are stacked. For example, the first external connection part 51 may be a metal layer that has a stacked structure in which a Ti layer, a Pt layer, and a Au layer are stacked in this order. A metal material similar to the first external connection part 51 can be used as the second and third external connection parts 52 and 53.

A portion of the first external connection part 51 contacts a portion of the first portion 41a of the first electrode 41 and is electrically connected with the first electrode 41 via a fifth opening 62a formed in the second insulating film 62.

A portion of the second external connection part 52 contacts a portion of the second portion 42a of the second electrode 42 and is electrically connected with the second electrode 42 via a sixth opening 62b formed in the second insulating film 62.

A portion of the third external connection part 53 contacts a portion of the third electrode 43 and is electrically connected with the third electrode 43 via a seventh opening 62c formed in the second insulating film 62.

For example, the first external connection part 51, the second external connection part 52, and the third external connection part 53 are electrically connected with an external circuit via conductive members such as solder, etc.

As shown in FIG. 1, in a top view, the first external connection part 51 and the second external connection part 52 are positioned on a third line L3 that passes through the center of the third external connection part 53 and is parallel to the first direction X. In other words, the first external connection part 51, the second external connection part 52, and the third external connection part 53 are separated from each other and arranged along the long-side direction of the stacked body 200 that is rectangular in a top view. By such an arrangement, the surface areas of the first, second, and third external connection parts 51, 52, and 53 can be increased compared to when two or three of the first external connection part 51, the second external connection part 52, or the third external connection part 53 are arranged along the short-side direction of the stacked body 200. The bonding areas of the conductive members such as solder or the like with the first, second, and third external connection parts 51, 52, and 53 can be increased thereby, the bonding reliability can be increased, and the resistances of the bonding portions can be reduced.

It is favorable for the third external connection part 53 to be positioned between the first external connection part 51 and the second external connection part 52 in a top view. Thereby, the current from the third external connection part 53 can be efficiently spread over the second light-emitting part 20.

As shown in FIG. 2, the stacked body 200 includes a light extraction surface 203 at the side opposite to the surface at which the first external connection part 51, the second external connection part 52, and the third external connection part 53 are located. The light extraction surface 203 is positioned between the substrate 100 and the first active layer 12. The first active layer 12 is positioned between the light extraction surface 203 and the second active layer 22.

It is favorable for the light emission peak wavelength of the first active layer 12 to be less than the light emission peak wavelength of the second active layer 22. For example, the light emission peak wavelength of the first active layer 12 is not less than 430 nm and not more than 480 nm, and the first active layer 12 emits blue light. For example, the light emission peak wavelength of the second active layer 22 is not less than 500 nm and not more than 540 nm, and the second active layer 22 emits green light. The light from the first active layer 12 and the light from the second active layer 22 are mainly extracted out of the stacked body 200 from the light extraction surface 203. Because the first active layer 12 that has a shorter light emission peak wavelength than the second active layer 22 is positioned between the light extraction surface 203 and the second active layer 22, the light that travels from the second active layer 22 toward the light extraction surface 203 is not easily absorbed by the first active layer 12.

According to the embodiment, chromaticity adjustment of the light emitted by the light-emitting element 1 is possible by selecting and applying a voltage to two of the first external connection part 51, the second external connection part 52, or the third external connection part 53.

When a positive potential is applied to the second external connection part 52 and a potential that is less than the potential applied to the second external connection part 52 is applied to the first external connection part 51, a forward voltage is applied to the first active layer 12, and the first active layer 12 emits light. At this time, for example, the light-emitting element 1 emits blue light due to the first active layer 12.

When a positive potential is applied to the third external connection part 53 and a potential that is less than the potential applied to the third external connection part 53 is applied to the second external connection part 52, a forward voltage is applied to the second active layer 22, and the second active layer 22 emits light. At this time, for example, the light-emitting element 1 emits green light due to the second active layer 22.

When a positive potential is applied to the third external connection part 53 and a potential that is less than the potential applied to the third external connection part 53 is applied to the first external connection part 51, a forward voltage is applied to the second and first active layers 22 and 12, and both the second and first active layers 22 and 12 emit light. At this time, a reverse voltage is applied to the tunnel junction (the p-n junction) of the tunnel junction layer 30. Therefore, a current due to the tunnel effect flows in the tunnel junction layer 30. That is, a current flows in the tunnel junction layer 30 by electrons that exist in the valence band tunneling to the conduction band.

Thus, the light-emitting element 1 emits, for example, mixed light of blue light and green light when both the first and second active layers 12 and 22 emit light. Also, the chromaticity of the light obtained by the light emission of the first active layer 12 and the light emission of the second active layer 22 can be adjusted by controlling the current values supplied to the first and second active layers 12 and 22 and/or the on/off duty ratio.

The third external connection part 53 functions as an anode terminal when only the second active layer 22 is caused to emit light and when both the second and first active layers 22 and 12 are caused to emit light. The third external connection part 53 is electrically connected with the fourth electrode 44 via the third electrode 43. The fourth electrode 44 is located at the upper surface of the second p-type layer 23 over a greater surface area than the third external connection part 53 and the third electrode 43. Therefore, the current that is supplied from the third external connection part 53 can be diffused by the fourth electrode 44 in the planar direction of the second p-type layer 23.

The second external connection part 52 functions as an anode terminal when only the first active layer 12 is caused to emit light. The second external connection part 52 is electrically connected with the second n-type layer 21 via the second electrode 42. The second n-type layer 21 has a higher sheet resistance than the fourth electrode 44 that is made of a metal material, so that the current that is supplied via the second electrode 42 is not easily diffused in the planar direction of the second n-type layer 21. As described below, the sheet resistance of the second n-type layer 21 is increased because the second n-type layer 21 cannot be made thick.

When forming the layers that are higher than the first n-type layer 11, there is a risk of thermal damage of the lower layers that are already formed; therefore, it is favorable for the film formation times the layers that are higher than the first n-type layer 11 to be less than the film formation time of the first n-type layer 11. In such a case, the layers that are higher than the first n-type layer 11 are thinner than the first n-type layer 11. When the thickness of the second n-type layer 21 is thinner than the first n-type layer 11, the sheet resistance of the second n-type layer 21 is greater than the sheet resistance of the first n-type layer 11. Therefore, it is difficult to diffuse the current supplied to the second n-type layer 21 via the second electrode 42 in the planar direction. When the diffusibility of the current is low, the current density of the current path between the second n-side contact portion 21a and the first n-side contact portion 11a that is proximate to the second n-side contact portion 21a becomes relatively high, and unevenness of the light emission distribution (the distribution of the brightness and/or chromaticity) may occur.

According to the embodiment, in a top view, the distance between the second n-side contact portion 21a at the anode side and the first n-side contact portion 11a at the cathode side when causing only the first active layer 12 to emit light becomes short. A high current density proximate to the second n-side contact portion 21a can be suppressed thereby, and unevenness of the light emission distribution can be reduced.

Specifically, according to the embodiment, the stacked body 200 is rectangular in a top view, and the center of the first n-side contact portion 11a is separated from the first line L1 that passes through the center of the second n-side contact portion 21a and is parallel to the first direction X. In a top view, the center of the first n-side contact portion 11a and the center of the second n-side contact portion 21a are positioned on a line that crosses the long-side direction of the stacked body 200 (the first direction X). For example, the first n-side contact portion 11a is positioned more proximate to one long side 201 than is the second n-side contact portion 21a, and the second n-side contact portion 21a is positioned more proximate to the other long side 201 than is the first n-side contact portion 11a.

When the length of the long side 201 of the stacked body 200 is the same for such an embodiment and for a comparative example in which the stacked body 200 is square in a top view, the distance between the first n-side contact portion 11a and the second n-side contact portion 21a in a top view can be shorter according to the embodiment. Also, the light emission area according to the embodiment can be larger than that of the comparative example in which the stacked body 200 is square in a top view for the same length of the short side 202 of the stacked body 200. Accordingly, according to the embodiment, unevenness of the light emission distribution can be reduced while ensuring a large light emission area.

By positioning the first n-side contact portion 11a on the second line L2 that passes through the center of the second n-side contact portion 21a and is parallel to the second direction Y in a top view, compared to when the first n-side contact portion 11a is shifted in the first direction X from the second line L2, the distance between the first n-side contact portion 11a and the second n-side contact portion 21a in a top view can be shortened. In a top view, the multiple second n-side contact portions 21a are separated from each other in the first direction X, and the multiple first n-side contact portions 11a are separated from each other in the first direction X. The bias of the current density distribution in the long-side direction of the stacked body 200 (the first direction X) can be reduced thereby. In such a case, a high current density proximate to the second n-side contact portion 21a can be further suppressed by setting the shortest distance between the second n-side contact portion 21a and the first n-side contact portion 11a in a top view to be less than the distance between the second n-side contact portions 21a that are next to each other in the first direction X and the distance between the first n-side contact portions 11a that are next to each other in the first direction X. Unevenness of the light emission distribution can be reduced thereby.

Second to sixth embodiments will now be described. The configurations of the second to sixth embodiments that are different from the first embodiment are mainly described, and a description of configurations similar to those of the first embodiment may be omitted.

Second Embodiment

Figure 3:
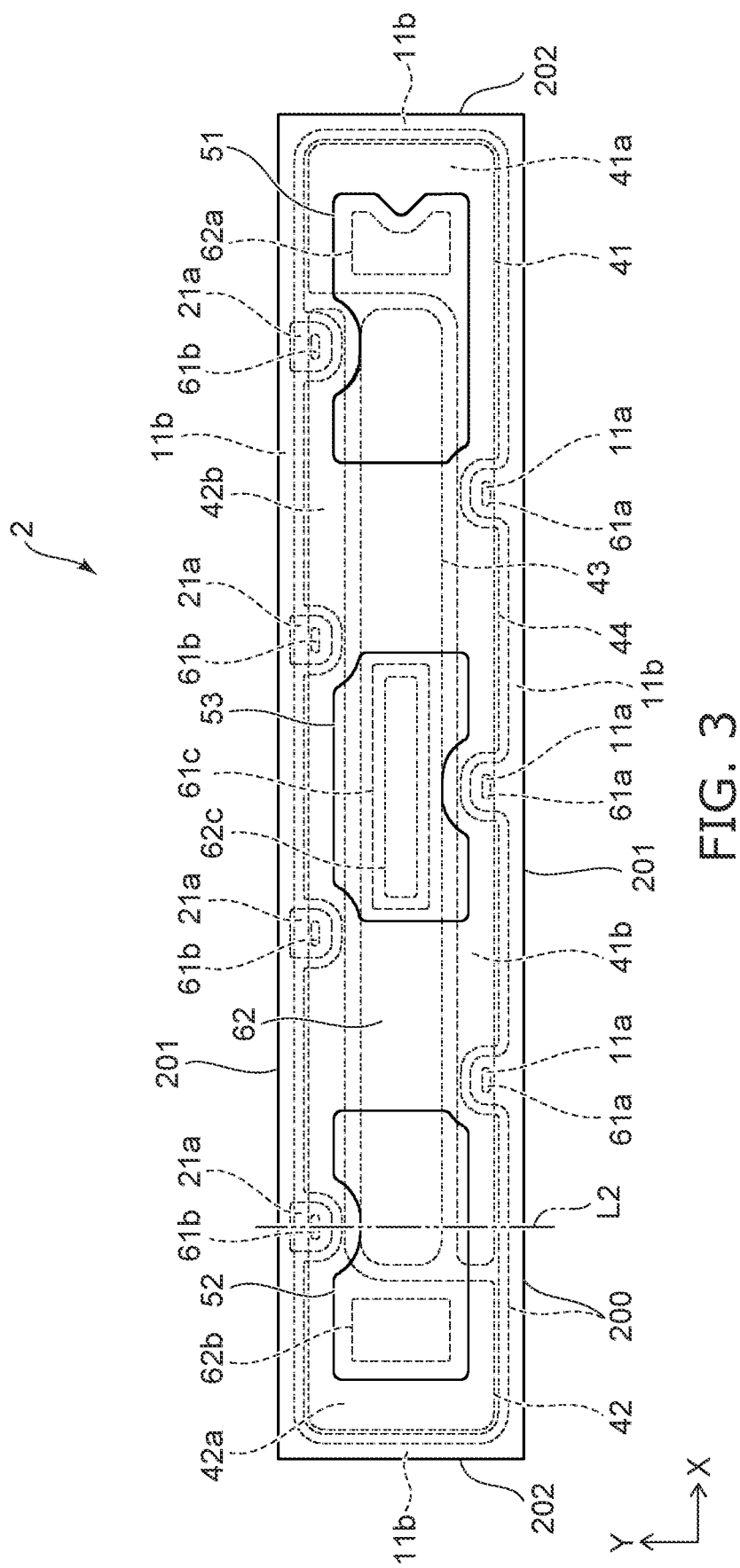
FIG. 3 is a schematic top view of a light-emitting element of a second embodiment of the invention.

FIG. 3 is a schematic top view of a light-emitting element 2 of a second embodiment of the invention.

In the light-emitting element 2 of the second embodiment, the quantity of the second n-side contact portions 21a is greater than the quantity of the first n-side contact portions 11a. In a top view, the first n-side contact portion 11a is not positioned on the second line L2 that passes through the center of the second n-side contact portion 21a and is parallel to the second direction Y, and the first n-side contact portion 11a and the second n-side contact portion 21a are separated in a direction that is oblique to the first direction X and the second direction Y.

As described above, a current density easily becomes high proximate to the second n-side contact portion 21a. Therefore, by setting the quantity of the second n-side contact portions 21a to be greater than the quantity of the first n-side contact portions 11a, a high current density proximate to the second n-side contact portion 21a can be further suppressed. Unevenness of the light emission distribution can be reduced thereby.

Third Embodiment

Figure 4:
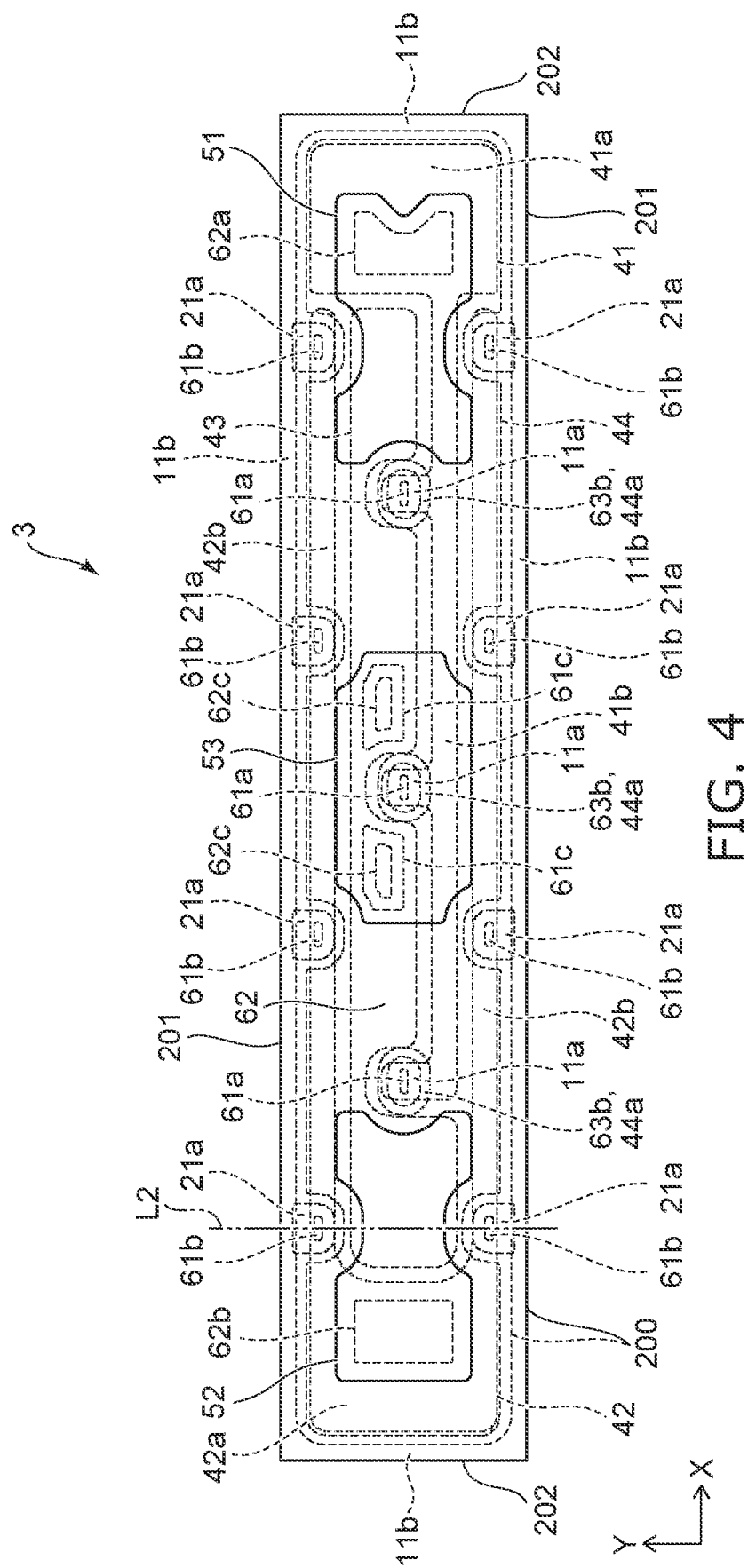
FIG. 4 is a schematic top view of a light-emitting element of a third embodiment of the invention.

FIG. 4 is a schematic top view of a light-emitting element 3 of a third embodiment of the invention.

The multiple second n-side contact portions 21a are separated from each other in the first direction X in a top view. The multiple first n-side contact portions 11a are separated from each other in the first direction X in a top view. The second n-side contact portions 21a are more proximate to the long side 201 of the stacked body 200 than is the first n-side contact portion 11a in a top view. The multiple second n-side contact portions 21a include a pair of two second n-side contact portions 21a that are separated from each other in the second direction Y in a top view. Multiple pairs of two second n-side contact portions 21a separated from each other in the second direction Y are arranged along the first direction X. The centers of the two second n-side contact portions 21a included in each pair are positioned on the second line L2 that is parallel to the second direction Y.

Other than the pair of multiple second n-side contact portions 21a described above, a pair of two second n-side contact portions 21a separated from each other in the direction that is oblique to the first direction X and the second direction Y in a top view also can be considered. The first n-side contact portion 11a is positioned between the two second n-side contact portions 21a of the pair that is arranged in the oblique direction. The first n-side contact portion 11a also may be positioned between the pair of two second n-side contact portions 21a that is separated from each other in the second direction Y.

According to the third embodiment, similarly to embodiments described above, unevenness of the light emission distribution can be reduced while ensuring a large light emission area. A high current density proximate to the second n-side contact portion 21a can be further suppressed by setting the quantity of the second n-side contact portions 21a to be greater than the quantity of the first n-side contact portions 11a.

In a top view, the first n-side contact portion 11a is exposed from under the second light-emitting part 20, the tunnel junction layer 30, the first p-type layer 13, and the first active layer 12 via an opening formed in the second light-emitting part 20, the tunnel junction layer 30, the first p-type layer 13, and the first active layer 12 at the central portion in the second direction Y.

In a top view, the first electrode 41 includes the first portion 41a that is connected with the first external connection part 51, and the first extension portion 41b that extends in the first direction X from the first portion 41a. The first electrode 41 contacts the first n-side contact portion 11a that is exposed from under the second light-emitting part 20, the tunnel junction layer 30, the first p-type layer 13, and the first active layer 12 via the first opening 61a formed in the first insulating film 61, an eighth opening 63b formed in the cover film 63, and a ninth opening 44a formed in the fourth electrode 44, and the first electrode 41 is electrically connected with the first n-type layer 11. The first external connection part 51 contacts the first portion 41a of the first electrode 41 and is electrically connected with the first electrode 41 via the fifth opening 62a formed in the second insulating film 62.

In a top view, the second electrode 42 includes the second portion 42a, and two second extension portions 42b that extend in the first direction X from the second portion 42a. The first portion 41a of the first electrode 41 and the second portion 42a of the second electrode 42 are separated from each other in the first direction X in a top view. The first extension portion 41b of the first electrode 41 is positioned between the two second extension portions 42b of the second electrode 42 in a top view.

The second electrode 42 contacts the second n-side contact portion 21a and is electrically connected with the second n-type layer 21 via the second opening 61b formed in the first insulating film 61. The second external connection part 52 contacts the second portion 42a of the second electrode 42 and is electrically connected with the second electrode 42 via the sixth opening 62b formed in the second insulating film 62.

The third electrode 43 extends in the first direction X between the first portion 41a of the first electrode 41 and the second portion 42a of the second electrode 42 in a top view. The third electrode 43 is positioned between the two second extension portions 42b of the second electrode 42 in a top view. The third electrode 43 contacts the fourth electrode 44 via the third opening 61c formed in the first insulating film 61 and the fourth opening 63a formed in the cover film 63, and the third electrode 43 is electrically connected with the second p-type layer 23 via the fourth electrode 44. The third external connection part 53 contacts the third electrode 43 and is electrically connected with the third electrode 43 via the seventh opening 62c formed in the second insulating film 62.

Fourth Embodiment

Figure 5:
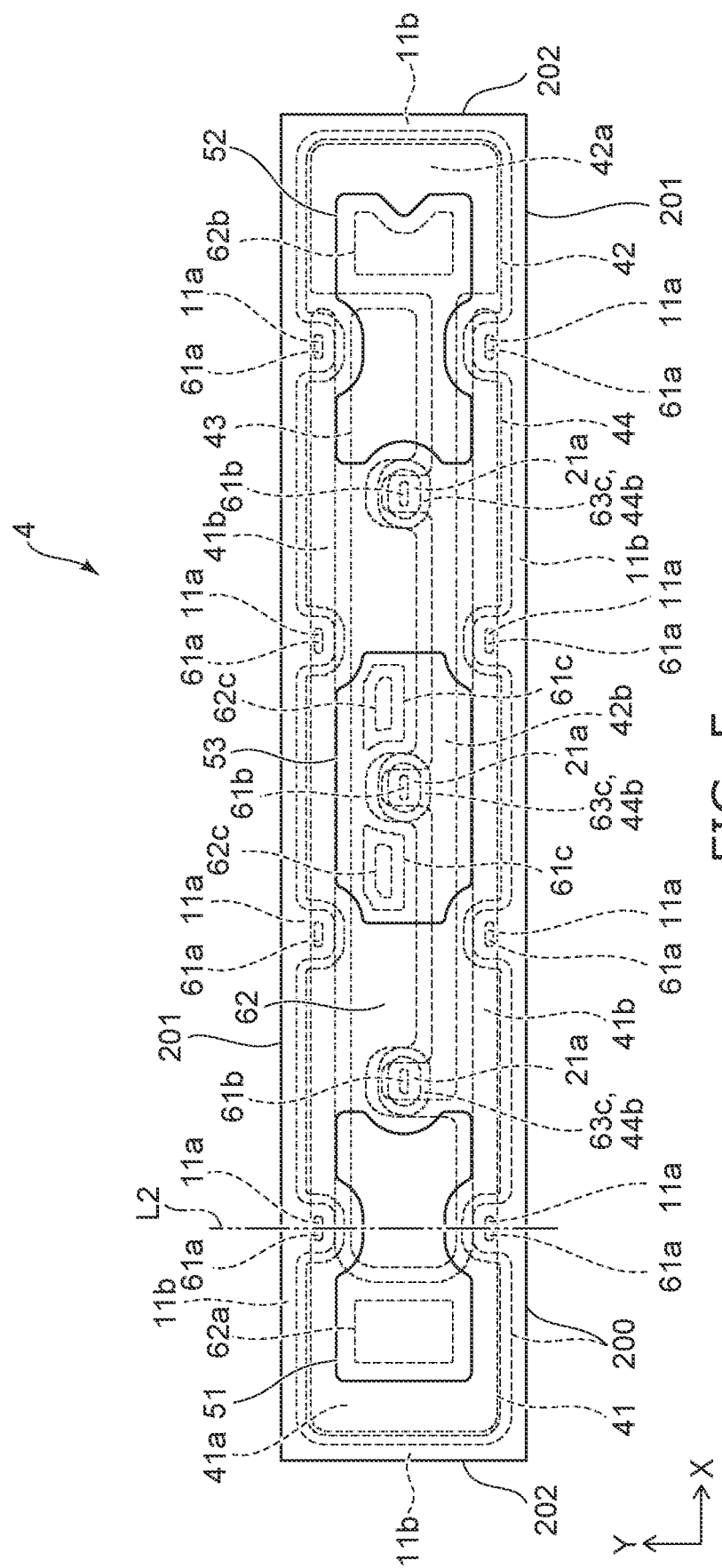
FIG. 5 is a schematic top view of a light-emitting element of a fourth embodiment of the invention.

FIG. 5 is a schematic top view of a light-emitting element 4 of a fourth embodiment of the invention.

The multiple second n-side contact portions 21a are separated from each other in the first direction X in a top view. The multiple first n-side contact portions 11a are separated from each other in the first direction X in a top view. The first n-side contact portion 11a is more proximate to the long side 201 of the stacked body 200 than is the second n-side contact portion 21a in a top view. The multiple first n-side contact portions 11a include a pair of two first n-side contact portions 11a separated from each other in the second direction Y in a top view. Multiple pairs of two first n-side contact portions 11a that are separated from each other in the second direction Y are arranged in the first direction X. The centers of the two first n-side contact portions 11a included in each pair are positioned on the second line L2 that is parallel to the second direction Y.

The multiple first n-side contact portions 11a also include two first n-side contact portions 11a that are separated in a direction oblique to the first direction X and the second direction Y in a top view. The second n-side contact portion 21a is positioned between the two first n-side contact portions 11a separated from each other in the direction oblique to the first direction X and the second direction Y in a top view. The second n-side contact portion 21a may be positioned between the two first n-side contact portions 11a that are separated from each other in the second direction Y.

According to the fourth embodiment, similarly to embodiments described above, unevenness of the light emission distribution can be reduced while ensuring a large light emission area. In the example shown in FIG. 5, the quantity of the second n-side contact portions 21a is less than the quantity of the first n-side contact portions 11a. The quantity of the second n-side contact portions 21a can be greater than the quantity of the first n-side contact portions 11a.

In a top view, the first electrode 41 includes the first portion 41a, and two first extension portions 41b that extend in the first direction X from the first portion 41a. In a top view, the second electrode 42 includes the second portion 42a, and the second extension portion 42b that extends in the first direction X from the second portion 42a. The first portion 41a of the first electrode 41 and the second portion 42a of the second electrode 42 are separated from each other in the first direction X in a top view. The second extension portion 42b of the second electrode 42 is positioned between the two first extension portions 41b of the first electrode 41 in a top view.

In a top view, the second n-side contact portion 21a is exposed from under the second p-type layer 23 and the second active layer 22 via an opening formed in the second p-type layer 23 and the second active layer 22 at the central portion in the second direction Y. The second electrode 42 contacts the second n-side contact portion 21a that is exposed from under the second p-type layer 23 and the second active layer 22 via the second opening 61b formed in the first insulating film 61, a tenth opening 63c formed in the cover film 63, and an eleventh opening 44b formed in the fourth electrode 44, and the second electrode 42 is electrically connected with the second n-type layer 21. The second external connection part 52 contacts the second portion 42a of the second electrode 42 and is electrically connected with the second electrode 42 via the sixth opening 62b formed in the second insulating film 62.

The third electrode 43 extends in the first direction X between the first portion 41a of the first electrode 41 and the second portion 42a of the second electrode 42 in a top view. The third electrode 43 is positioned between the two first extension portions 41b of the first electrode 41 in a top view. The third electrode 43 contacts the fourth electrode 44 via the third opening 61c formed in the first insulating film 61 and the fourth opening 63a formed in the cover film 63, and the third electrode 43 is electrically connected with the second p-type layer 23 via the fourth electrode 44. The third external connection part 53 contacts the third electrode 43 and is electrically connected with the third electrode 43 via the seventh opening 62c formed in the second insulating film 62.

According to the third and fourth embodiments, the quantity of the first n-side contact portions 11a and the quantity of the second n-side contact portions 21a are not limited to the illustrated quantities. The first n-side contact portion 11a may be formed in a line shape extending in the first direction X. The second n-side contact portion 21a may be formed in a line shape extending in the first direction X.

Fifth Embodiment

Figure 6:
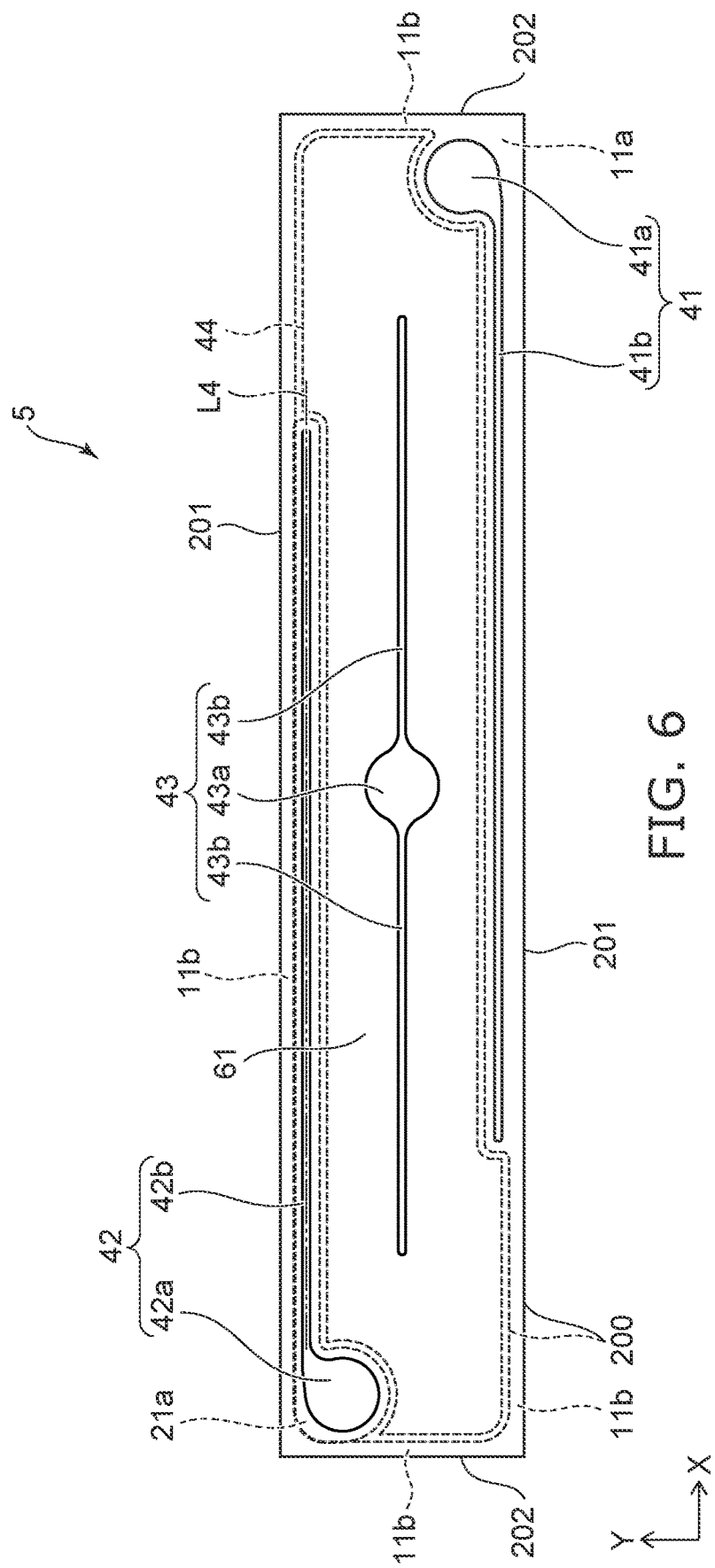
FIG. 6 is a schematic top view of a light-emitting element of a fifth embodiment of the invention.

FIG. 6 is a schematic top view of a light-emitting element 5 of a fifth embodiment of the invention.

The first n-side contact portion 11a extends in the first direction X from a first corner of the rectangle of the stacked body 200 in a top view. The second n-side contact portion 21a extends in the first direction X from a second corner positioned diagonal to the first corner of the rectangle of the stacked body 200 in a top view. The first n-side contact portion 11a extends in the first direction X at a position more proximate to one long side 201 of the stacked body 200 than is the second n-side contact portion 21a, and the second n-side contact portion 21a extends in the first direction X at a position more proximate to the other long side 201 of the stacked body 200 than is the first n-side contact portion 11a. The extension portion of the first n-side contact portion 11a and the extension portion of the second n-side contact portion 21a are separated from each other in the second direction Y in a top view. In a top view, the first n-side contact portion 11a is separated from a centerline L4 that bisects the extension portion of the second n-side contact portion 21a in the second direction Y.

The fourth electrode 44 that is located at the upper surface of the second p-type layer 23 is a light-transmitting conductive film that is transmissive to the wavelengths of the light from the first and second active layers 12 and 22. For example, an oxide film such as ITO (Indium Tin Oxide), ZnO (Zinc Oxide), etc., can be used as the light-transmitting conductive film.

According to the fifth embodiment and to the sixth embodiment that is described below, the cover film 63 shown in FIG. 2 is not included, and the fourth electrode 44 is directly covered with the first insulating film 61. The first insulating film 61 is transmissive to the wavelengths of the light from the first and second active layers 12 and 22. According to the fifth and sixth embodiments, the second insulating film 62 and the first to third external connection parts 51 to 53 are not included.

The first electrode 41 contacts the first n-side contact portion 11a and is electrically connected with the first n-type layer 11. The first electrode 41 includes the first portion 41a and the first extension portion 41b. In a top view, the first portion 41a is located at the aforementioned first corner of the rectangle of the stacked body 200, and the first extension portion 41b extends in the first direction X from the first portion 41a.

The second electrode 42 contacts the second n-side contact portion 21a and is electrically connected with the second n-type layer 21. The second electrode 42 includes the second portion 42a and the second extension portion 42b. In a top view, the second portion 42a is located at the aforementioned second corner of the rectangle of the stacked body 200, and the second extension portion 42b extends in the first direction X from the second portion 42a.

The third electrode 43 contacts the fourth electrode 44 and is electrically connected with the second p-type layer 23 via the fourth electrode 44. The third electrode 43 is positioned between the first extension portion 41b of the first electrode 41 and the second extension portion 42b of the second electrode 42 in a top view. The third electrode 43 includes a third portion 43a and two third extension portions 43b. The third portion 43a is positioned at the central portion of the rectangle of the stacked body 200 in a top view. The two third extension portions 43b extend from the third portion 43a in mutually-opposite directions that are parallel to the first direction X.

It is favorable to employ so-called flip-chip mounting for the light-emitting elements 1 to 4 of the first to fourth embodiments described above, in which the first to third external connection parts 51 to 53 face the mounting substrate, and the light extraction surface 203 that is included in the first n-type layer 11 of the stacked body 200 faces away from the surface (the mounting surface) of the mounting substrate.

It is favorable to employ so-called face-up mounting for the light-emitting element 5 of the fifth embodiment, in which the first to fourth electrodes 41 to 44 are mounted facing away from the surface of the mounting substrate. The light from the first and second active layers 12 and 22 is mainly extracted out of the light-emitting element 5 via the second p-type layer 23 and the fourth electrode 44 that is a light-transmitting conductive film. For example, the first portion 41a of the first electrode 41, the second portion 42a of the second electrode 42, and the third portion 43a of the third electrode 43 are electrically connected with a circuit of the mounting substrate via conductive members such as wires, etc.

When the length of the long side 201 of the stacked body 200 is the same for the fifth embodiment and a comparative example in which the stacked body 200 is square in a top view, the distance in a top view between the first n-side contact portion 11a and the second n-side contact portion 21a can be shorter for the fifth embodiment. When the length of the short side 202 of the stacked body 200 is the same for the fifth embodiment and the comparative example in which the stacked body 200 is square in a top view, the light emission area can be greater for the fifth embodiment. Accordingly, according to the fifth embodiment, unevenness of the light emission distribution can be reduced while ensuring a large light emission area.

Sixth Embodiment

Figure 7:
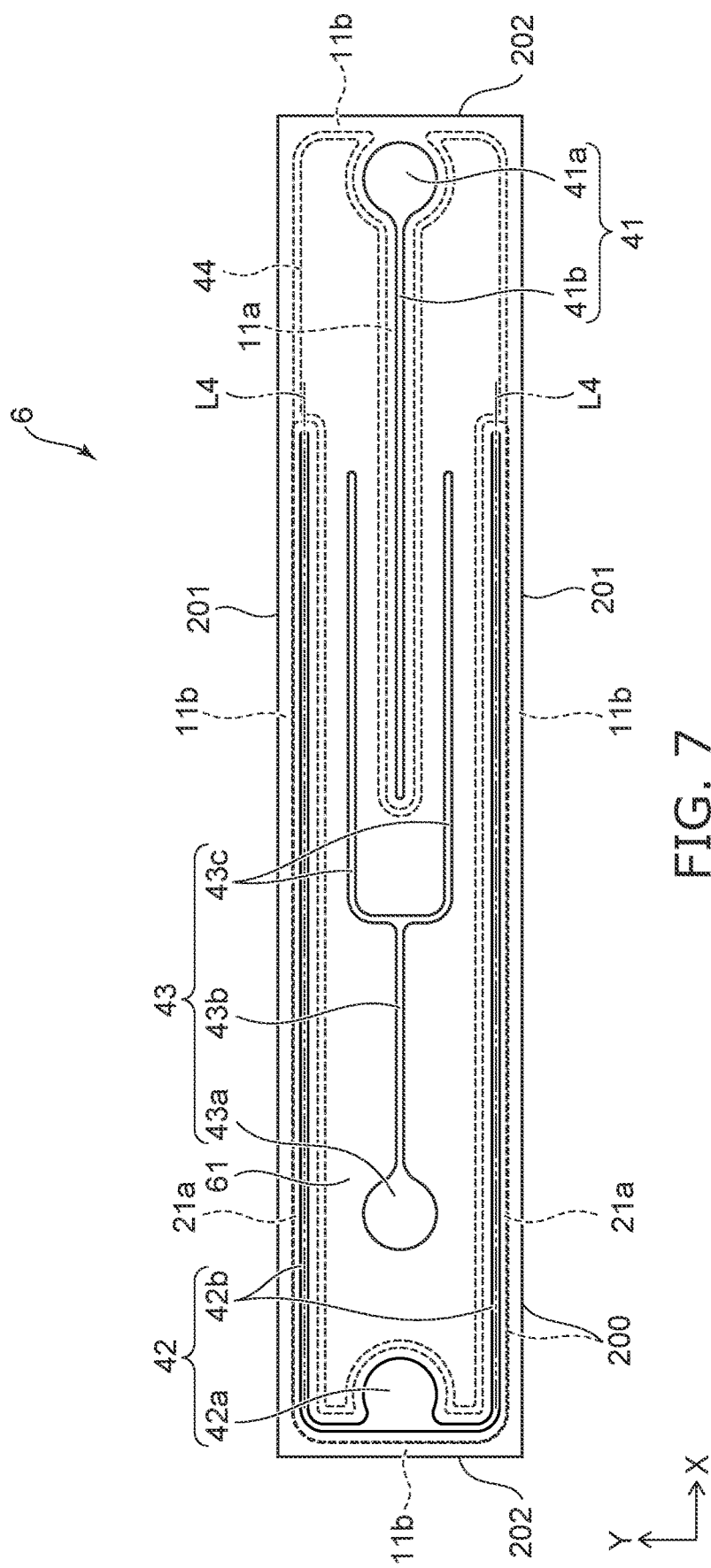
FIG. 7 is a schematic top view of a light-emitting element of a sixth embodiment of the invention.

FIG. 7 is a schematic top view of a light-emitting element 6 of a sixth embodiment of the invention.

Similarly to the light-emitting element 5 of the fifth embodiment, it is favorable to employ so-called face-up mounting for the light-emitting element 6 of the sixth embodiment, in which the first to fourth electrodes 41 to 44 are mounted to face away from the surface of the mounting substrate. The light from the first and second active layers 12 and 22 is mainly extracted out of the light-emitting element 6 via the second p-type layer 23 and the fourth electrode 44 that is a light-transmitting conductive film.

The first n-side contact portion 11a extends in the first direction X from one short side 202 side of the rectangle of the stacked body 200 in a top view. The second n-side contact portion 21a extends in the first direction X from the other short side 202 side of the rectangle of the stacked body 200 in a top view. The second n-side contact portion 21a includes two extension portions that are separated from each other in the second direction Y in a top view. A portion of the extension portion of the first n-side contact portion 11a is positioned between the two extension portions of the second n-side contact portion 21a in a top view. In a top view, the first n-side contact portion 11a is separated from the centerlines L4 that bisect the extension portions of the second n-side contact portion 21a in the second direction Y.

The first electrode 41 contacts the first n-side contact portion 11a and is electrically connected with the first n-type layer 11. The first electrode 41 includes the first portion 41a and the first extension portion 41b. In a top view, the first portion 41a is proximate to one short side 202 of the rectangle of the stacked body 200, and the first extension portion 41b extends in the first direction X from the first portion 41a.

The second electrode 42 contacts the second n-side contact portion 21a and is electrically connected with the second n-type layer 21. The second electrode 42 includes the second portion 42a and the two second extension portions 42b. The second extension portions 42b are located on extension portions of the second n-side contact portion 21a. In a top view, the second portion 42a is proximate to the other short side 202 of the rectangle of the stacked body 200, and the second extension portion 42b extends in the first direction X from the second portion 42a.

The third electrode 43 contacts the fourth electrode 44 and is electrically connected with the second p-type layer 23 via the fourth electrode 44. In a top view, the third electrode 43 is positioned between the two second extension portions 42b of the second electrode 42. The third electrode 43 includes the third portion 43a, and the third extension portion 43b that extends in the first direction X from the third portion 43a. The third electrode 43 also includes two fourth extension portions 43c that extend in the first direction X from the third extension portion 43b. A portion of the first extension portion 41b of the first electrode 41 is positioned between the two fourth extension portions 43c of the third electrode 43 in a top view.

In the light-emitting element 6 of the sixth embodiment, the distance in a top view between the first n-side contact portion 11a and the second n-side contact portion 21a can be shortened. A high current density proximate to the second n-side contact portion 21a can be suppressed thereby, and unevenness of the light emission distribution can be reduced.

Embodiments of the present invention have been described with reference to specific examples. However, the present invention is not limited to these specific examples. Based on the above-described embodiments of the present invention, all embodiments that can be implemented with appropriate design modification by one skilled in the art are also within the scope of the present invention as long as the gist of the present invention is included. Further, within the scope of the spirit of the present invention, one skilled in the art can conceive various modifications that fall within the scope of the present invention.

What is claimed is:

1. A light-emitting element, comprising:
 a stacked body made of a nitride semiconductor, the stacked body including a long side and a short side in a top view, the long side extending in a first direction, the short side extending in a second direction orthogonal to the first direction, the short side being shorter than the long side, the stacked body comprising:
  a first n-type layer,
  a first active layer located on the first n-type layer,
  a first p-type layer located on the first active layer,
  a tunnel junction layer located on the first p-type layer,
  a second n-type layer located on the tunnel junction layer,
  a second active layer located on the second n-type layer, and
  a second p-type layer located on the second active layer;
 a first electrode electrically connected with the first n-type layer;
 a second electrode electrically connected with the second n-type layer;
 a third electrode electrically connected with the second p-type layer;
 a first external connection part electrically connected with the first electrode;
 a second external connection part electrically connected with the second electrode; and
 a third external connection part electrically connected with the third electrode;
wherein:
 a light emission peak wavelength of the first active layer is different from a light emission peak wavelength of the second active layer;

the first n-type layer comprises a first n-side contact portion contacting the first electrode;

the second n-type layer comprises a second n-side contact portion contacting the second electrode;

in a top view, a center of the first n-side contact portion is separated from a first line that passes through a center of the second n-side contact portion and is parallel to the first direction; and in a top view, the first external connection part and the second external connection part are positioned on a third line that passes through a center of the third external connection part and is parallel to the first direction.

2. The element according to claim 1, wherein:

in a top view, the first n-side contact portion is positioned on a second line that passes through the center of the second n-side contact portion and is parallel to the second direction.

3. The element according to claim 1, wherein:

in a top view, the third external connection part is positioned between the first external connection part and the second external connection part.

4. The element according to claim 1, wherein:

in a top view, in a direction crossing the first direction, two of the second n-side contact portions are separated from each other, and the first n-side contact portion is positioned between said two of the second n-side contact portions.

5. The element according to claim 1, wherein:

in a top view, in a direction crossing the first direction, two of the first n-side contact portions are separated from each other, and the second n-side contact portion is positioned between said two of the first n-side contact portions.

6. The element according to claim 1, wherein:

a quantity of the second n-side contact portions is greater than a quantity of the first n-side contact portions.

7. The element according to claim 1, wherein:

a plurality of the second n-side contact portions are separated from each other in the first direction; and in a top view, a shortest distance between a first of the second n-side contact portions and the first n-side contact portion is less than a distance between the first of the second n-side contact portions and a second of the second n-side contact portions that are next to each other in the first direction.

8. The element according to claim 1, further comprising:

a fourth electrode located at an upper surface of the second p-type layer; wherein:

a resistivity of the fourth electrode is lower than a resistivity of the second p-type layer; and the third electrode is located at an upper surface of the fourth electrode.

9. The element according to claim 1, wherein:

the stacked body includes a light extraction surface;

the light extraction surface is at a side opposite to a surface at which the first, second, and third external connection parts are located;

the first active layer is positioned between the light extraction surface and the second active layer; and the light emission peak wavelength of the first active layer is less than the light emission peak wavelength of the second active layer.

10. A light-emitting element, comprising:

a stacked body made of a nitride semiconductor, the stacked body including a long side and a short side in a top view, the long side extending in a first direction, the short side extending in a second direction orthogonal to the first direction, the short side being shorter than the long side, the stacked body comprising:

a first n-type layer, a first active layer located on the first n-type layer, a first p-type layer located on the first active layer, a tunnel junction layer located on the first p-type layer, a second n-type layer located on the tunnel junction layer, a second active layer located on the second n-type layer, and a second p-type layer located on the second active layer;

a first electrode electrically connected with the first n-type layer;

a second electrode electrically connected with the second n-type layer; and a third electrode electrically connected with the second p-type layer; wherein:

a light emission peak wavelength of the first active layer is different from a light emission peak wavelength of the second active layer;

the first n-type layer comprises a first n-side contact portion contacting the first electrode;

the second n-type layer comprises a plurality of second n-side contact portions contacting the second electrode, the plurality of n-side contact portions being separated from each other in the first direction;

in a top view, a center of the first n-side contact portion is separated from a first line that passes through a center of the second n-side contact portion and is parallel to the first direction; and in a top view, a shortest distance between a first of the second n-side contact portions and the first n-side contact portion is less than a distance between the first of the second n-side contact portions and a second of the second n-side contact portions that are next to each other in the first direction.

11. The element according to claim 10, wherein:

in a top view, the first n-side contact portion is positioned on a second line that passes through the center of the second n-side contact portion and is parallel to the second direction.

12. The element according to claim 10, further comprising:

a first external connection part electrically connected with the first electrode;

a second external connection part electrically connected with the second electrode; and a third external connection part electrically connected with the third electrode;

wherein:

in a top view, the first external connection part and the second external connection part are positioned on a third line that passes through a center of the third external connection part and is parallel to the first direction; and in a top view, the third external connection part is positioned between the first external connection part and the second external connection part.

13. The element according to claim 10, further comprising:

a fourth electrode located at an upper surface of the second p-type layer; wherein:

a resistivity of the fourth electrode is lower than a resistivity of the second p-type layer; and the third electrode is located at an upper surface of the fourth electrode.

14. The element according to claim 12, wherein:
the stacked body includes a light extraction surface;
the light extraction surface is at a side opposite to a surface at which the first, second, and third external connection parts are located;
the first active layer is positioned between the light extraction surface and the second active layer; and
the light emission peak wavelength of the first active layer is less than the light emission peak wavelength of the second active layer.

15. A light-emitting element, comprising:
a stacked body made of a nitride semiconductor, the stacked body including a long side and a short side in a top view, the long side extending in a first direction, the short side extending in a second direction orthogonal to the first direction, the short side being shorter than the long side, the stacked body comprising:
a first n-type layer,
a first active layer located on the first n-type layer,
a first p-type layer located on the first active layer,
a tunnel junction layer located on the first p-type layer,
a second n-type layer located on the tunnel junction layer,
a second active layer located on the second n-type layer, and
a second p-type layer located on the second active layer;
a first electrode electrically connected with the first n-type layer;
a second electrode electrically connected with the second n-type layer; and
a fourth electrode located at an upper surface of the second p-type layer; wherein:
a light emission peak wavelength of the first active layer is different from a light emission peak wavelength of the second active layer;
the first n-type layer comprises a first n-side contact portion contacting the first electrode;
the second n-type layer comprises a second n-side contact portion contacting the second electrode;
in a top view, a center of the first n-side contact portion is separated from a first line that passes through a center of the second n-side contact portion and is parallel to the first direction;
a resistivity of the fourth electrode is lower than a resistivity of the second p-type layer; and
the third electrode is located at an upper surface of the fourth electrode.

16. The element according to claim 15, wherein:
in a top view, the first n-side contact portion is positioned on a second line that passes through the center of the second n-side contact portion and is parallel to the second direction.

17. The element according to claim 15, further comprising:
a first external connection part electrically connected with the first electrode;
a second external connection part electrically connected with the second electrode; and
a third external connection part electrically connected with the third electrode;
wherein:
in a top view, the first external connection part and the second external connection part are positioned on a third line that passes through a center of the third external connection part and is parallel to the first direction;
in a top view, the third external connection part is positioned between the first external connection part and the second external connection part.

18. The element according to claim 17, wherein:
the stacked body includes a light extraction surface;
the light extraction surface is at a side opposite to a surface at which the first, second, and third external connection parts are located;
the first active layer is positioned between the light extraction surface and the second active layer; and
the light emission peak wavelength of the first active layer is less than the light emission peak wavelength of the second active layer.

* * * * *